(12) United States Patent
Lius et al.

(10) Patent No.: US 10,861,879 B2
(45) Date of Patent: Dec. 8, 2020

(54) DISPLAY DEVICE

(71) Applicant: InnoLux Corporation, Miao-Li County (TW)

(72) Inventors: Chandra Lius, Miao-Li County (TW); Nai-Fang Hsu, Miao-Li County (TW)

(73) Assignee: INNOLUX CORPORATION

( * ) Notice: Subject to any disclaimer, the term of this patent is extended or adjusted under 35 U.S.C. 154(b) by 0 days.

(21) Appl. No.: 16/402,478

(22) Filed: May 3, 2019

(65) Prior Publication Data
US 2019/0258349 A1 Aug. 22, 2019

Related U.S. Application Data

(63) Continuation of application No. 15/486,336, filed on Apr. 13, 2017, now Pat. No. 10,325,930.
(Continued)

(51) Int. Cl.
*H01L 29/786* (2006.01)
*H01L 27/12* (2006.01)
(Continued)

(52) U.S. Cl.
CPC ........ *H01L 27/1225* (2013.01); *G02F 1/1368* (2013.01); *G02F 1/13338* (2013.01);
(Continued)

(58) Field of Classification Search
CPC ............. H01L 27/1225; H01L 27/1255; H01L 27/1248; H01L 29/78696; H01L 29/7869; H01L 29/78675; H01L 29/78648; H01L 29/42356; H01L 29/24; H01L 27/1251; H01L 27/124; H01L 27/1222;
(Continued)

(56) References Cited

U.S. PATENT DOCUMENTS

2005/0099411 A1* 5/2005 Van Brocklin ..... G02F 1/13336
345/204
2007/0262314 A1* 11/2007 Noguchi ........... H01L 29/78624
257/72
(Continued)

FOREIGN PATENT DOCUMENTS

TW 201606988 A 2/2016

*Primary Examiner* — Steven H Loke
*Assistant Examiner* — Samuel Park
(74) *Attorney, Agent, or Firm* — Bacon & Thomas, PLLC (57) ABSTRACT

A display device is disclosed, which includes: a first substrate; a first transistor disposed on the first substrate and including a first gate electrode, a first drain electrode, a first source electrode, and a first oxide semiconductor layer, wherein the first oxide semiconductor layer is oppositely disposed on the first gate electrode, and the first drain electrode and the first source electrode are electrically connected to the first oxide semiconductor layer; and a second transistor disposed on the first substrate and including a second gate electrode, a second drain electrode, a second source electrode, and a silicon semiconductor layer, wherein the second gate electrode is oppositely disposed on the silicon semiconductor layer, the second drain electrode and the second source electrode are electrically connected to the silicon semiconductor layer, and the first gate electrode is electrically connected to one of the second drain electrode and the second source electrode.

18 Claims, 5 Drawing Sheets

Related U.S. Application Data (60) Provisional application No. 62/429,162, filed on Dec. 2, 2016.

(51) Int. Cl.
| | |
|---|---|
| G06F 3/041 | (2006.01) |
| G02F 1/1333 | (2006.01) |
| G02F 1/1343 | (2006.01) |
| H01L 27/32 | (2006.01) |
| H01L 29/24 | (2006.01) |
| H01L 29/423 | (2006.01) |
| G02F 1/1368 | (2006.01) |
| H01L 29/49 | (2006.01) |

(52) U.S. Cl.
CPC .. *G02F 1/133345* (2013.01); *G02F 1/134309* (2013.01); *G06F 3/0412* (2013.01); *H01L 27/124* (2013.01); *H01L 27/1222* (2013.01); *H01L 27/1248* (2013.01); *H01L 27/1251* (2013.01); *H01L 27/1255* (2013.01); *H01L 27/323* (2013.01); *H01L 27/3276* (2013.01); *H01L 29/24* (2013.01); *H01L 29/42356* (2013.01); *H01L 29/7869* (2013.01); *H01L 29/78648* (2013.01); *H01L 29/78675* (2013.01); *H01L 29/78696* (2013.01); *G02F 2001/13685* (2013.01); *G02F 2001/133388* (2013.01); *H01L 27/3262* (2013.01); *H01L 29/4908* (2013.01); *H01L 29/78672* (2013.01)

(58) Field of Classification Search
CPC .............. H01L 27/3276; H01L 27/323; H01L 29/78672; H01L 29/4908; H01L 27/3262; H01L 27/3244; H01L 27/1214; H01L 23/3677; H01L 24/48; H01L 23/49827; H01L 24/32; H01L 24/73; H01L 24/16; H01L 24/45; H01L 2924/0002; G02F 1/1368; G02F 1/134309; G02F 1/13338; G02F 1/133345; G02F 2001/13685; G02F 2001/133388; G06F 3/0412; G06F 2203/04103; G06F 3/047; G06F 3/0418
See application file for complete search history.

(56) References Cited

U.S. PATENT DOCUMENTS

| | | | |
|---|---|---|---|
| 2010/0176395 A1* | 7/2010 | Choi | H01L 27/12 257/43 |
| 2011/0175102 A1* | 7/2011 | Hatano | H01L 27/1266 257/72 |
| 2013/0334523 A1 | 12/2013 | Yamazaki | |
| 2015/0171120 A1* | 6/2015 | Kaneko | H01L 27/088 438/104 |
| 2017/0033235 A1* | 2/2017 | Tsao | H01L 29/78618 |

* cited by examiner

DISPLAY DEVICE

CROSS REFERENCE TO RELATED APPLICATION

This application claims the benefit of filing date of U.S. Provisional Application Ser. No. 62/429,162 filed Dec. 2, 2016 under 35 USC § 119(e)(1).

This application is a continuation (CA) of U.S. Patent application for "Display device", U.S. application Ser. No. 15/486,336 filed Apr. 13, 2017, and the subject matter of which is incorporated herein by reference.

BACKGROUND

1. Field

The present disclosure relates to a display device and, more particularly, to a display device with a transistor comprising an oxide semiconductor layer with various element concentrations.

2. Description of Related Art

With the continuous advancement of technologies related to displays, all the display panels are now developed toward compactness, thinness, and lightness. This trend makes thin displays, such as liquid crystal display panels, organic light-emitting diode display panels and inorganic light-emitting diode display panels, replacing cathode-ray-tube displays as the mainstream display devices on the market. Applications of thin displays are numerous. Most electronic products for daily use, such as mobile phones, notebook computers, video cameras, still cameras, music displays, mobile navigators, and TV sets, employ such display panels.

While liquid crystal display devices and organic light-emitting diode display devices are popular on the market, in which LCD display devices particularly enjoy technical maturity, manufacturers pay even more effort to improve display devices in terms of display quality thereby answering to ongoing technical development of display devices and consumers' increasing demands.

The thin film transistor (TFT) structure can be polycrystalline silicon thin film transistors (TFT) featuring high carrier mobility, or metal oxide thin film transistors (TFT) featuring low leakage. There are presently no displays combining these two types of transistors because the manufacturing processes for making the two are not quite compatible, making the overall manufacturing of such display devices complicated (such as by requiring more times of chemical vapor deposition).

In view of this, a need exists for an improved and simplified process for manufacturing a thin film transistor (TFT) substrate that has both a polycrystalline silicon thin film transistor (TFT) and a metal oxide thin film transistor (TFT).

SUMMARY

An object of the present disclosure is to provide a display device comprising a transistor with an oxide semiconductor layer, wherein the atomic percentages of elements in the oxide semiconductor layer are adjusted to provide improved electrical performance or reliability.

In one aspect of the present disclosure, the display device comprises: a first substrate; a first transistor disposed over the first substrate, wherein the first transistor comprises an oxide semiconductor layer, and a second transistor disposed over the first substrate, wherein the second transistor comprises a silicon semiconductor layer, wherein the oxide semiconductor layer comprises indium, gallium, and oxygen; and a ratio of an atomic percentage of oxygen to a sum of atomic percentages of indium and gallium in the oxide semiconductor layer is greater than or equal to 1 and less than or equal to 3.

In another aspect of the present disclosure, the display device comprises: a first substrate; and a first transistor disposed over the first substrate, wherein the first transistor comprises an oxide semiconductor layer, wherein the oxide semiconductor layer comprises indium, gallium, zinc, and oxygen; a ratio of an atomic percentage of oxygen to a sum of atomic percentages of indium and gallium in the oxide semiconductor layer is greater than or equal to 1 and less than or equal to 3; and a ratio of a sum of atomic percentages of indium and gallium to an atomic percentage of zinc in the oxide semiconductor layer is greater than or equal to 1 and less than or equal to 3.

In the display device of the two above aspects, the atomic percentages of elements in the oxide semiconductor layer of the first transistor are adjusted. More specifically, the ratio of the atomic percentage of oxygen to the sum of the atomic percentages of indium and gallium in the oxide semiconductor layer is greater than or equal to 1 and less than or equal to 3, i.e. $1 \leq O/(In+Ga) \leq 3$.

When the atomic percentages in the oxide semiconductor layer are within the above range, the first transistor comprising the oxide semiconductor layer has the improved electrical performance and reliability.

Other objects, advantages, and novel features of the disclosure will become more apparent from the following detailed description when taken in conjunction with the accompanying drawings.

DETAILED DESCRIPTION OF EMBODIMENT

The following embodiments when read with the accompanying drawings are made to clearly exhibit the above-mentioned and other technical contents, features and effects of the present disclosure. Through the exposition by means of the specific embodiments, people would further understand the technical means and effects the present disclosure adopts to achieve the above-indicated objectives. Moreover, as the contents disclosed herein should be readily understood and can be implemented by a person skilled in the art, all equivalent changes or modifications which do not depart from the concept of the present disclosure should be encompassed by the appended claims.

Furthermore, the ordinals recited in the specification and the claims such as "first", "second" and so on are intended only to describe the elements claimed and imply or represent neither that the claimed elements have any proceeding ordinals, nor that sequence between one claimed element and another claimed element or between steps of a manufacturing method. The use of these ordinals is merely to differentiate one claimed element having a certain designation from another claimed element having the same designation.

Furthermore, the ordinals recited in the specification and the claims such as "above", "over", or "on" are intended not only directly contact with the other first substrate or film, but also intended indirectly contact with the other first substrate or film.

Embodiment

Figure 1:
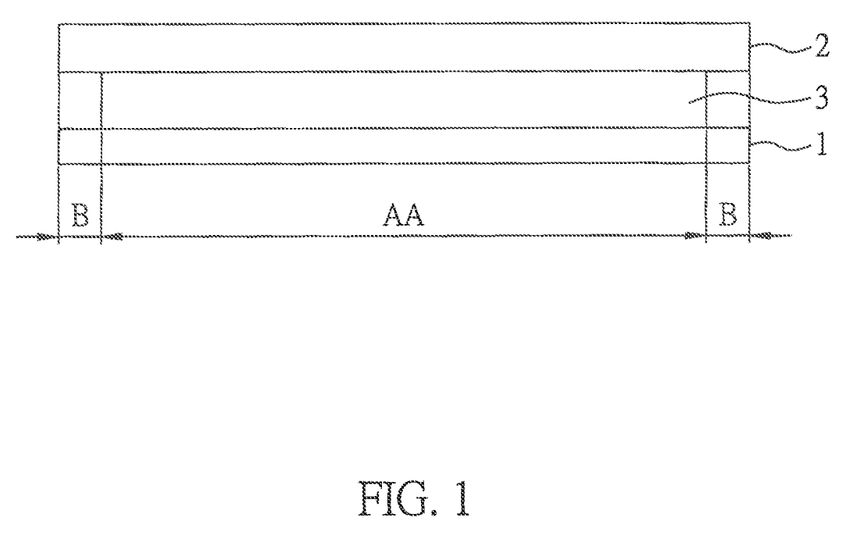
FIG. 1 is a schematic cross sectional view of a display device according to one embodiment of the present disclosure.

FIG. 1 is a schematic cross sectional view of a display device of the present embodiment. Therein, the display device comprises: a first substrate 1; a second substrate 2 opposite to the first substrate 1; and a display medium layer 3 arranged between the first substrate 1 and the second substrate 2. In the present embodiment, the first substrate 1 and the second substrate 2 may be prepared by glass, plastic, a flexible material or a thin film; but the present disclosure is not limited thereto. When the first substrate 1 and the second substrate 2 is prepared by the plastic, the flexible material or the thin film, the display device can be a flexible display device. In the present embodiment, the display medium 3 may comprise a liquid crystal layer or a light emitting diode (for example, an inorganic light emitting diode or an organic light emitting diode); but the present disclosure is not limited thereto. In addition, in other embodiments of the present disclosure, when the display medium 3 is the light emitting diode, the display device can be optionally made without the second substrate 2.

Figure 2:
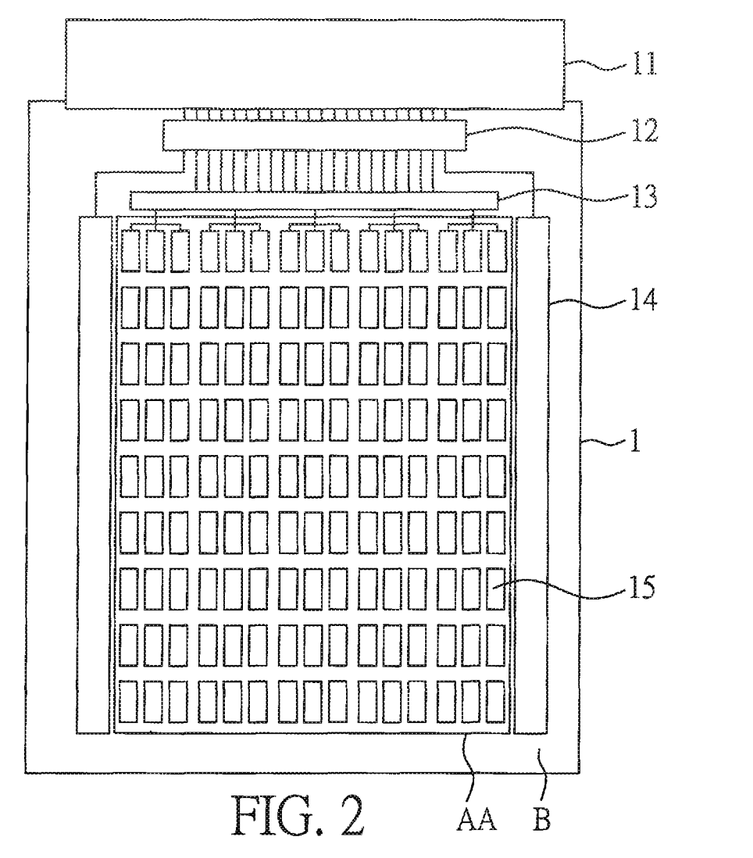
FIG. 2 is a top view of a display device according to one embodiment of the present disclosure.

FIG. 2 is a top view of a display device of the present embodiment. As shown in FIGS. 1 and 2, the display device of the present embodiment comprises: a display region AA and a peripheral region B, and the peripheral region B is adjacent to the display region AA. As shown in FIG. 2, the display device of the present embodiment comprises: a print circuit board 11 partially disposed on the peripheral region B; an IC 12 disposed on the peripheral region B and electrically connecting to the print circuit board 11; a demultiplexer 13 disposed on the peripheral region B and electrically connecting to the IC 12; a driver circuit 14 disposed on the peripheral region B and electrically connecting to the IC 12; and plural pixel units 15 disposed on the display region AA, wherein the pixel units 15 receive signals from the driver circuit 14 and the demultiplexer 13.

Figure 3:
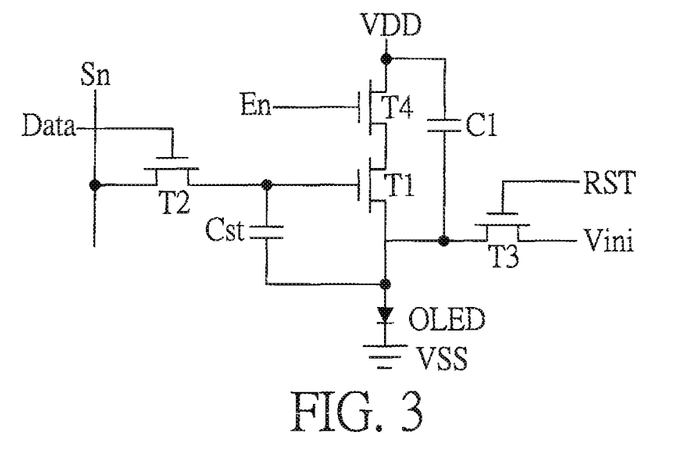
FIG. 3 is an equivalent-circuit diagram of a pixel of the display device according to one embodiment of the present disclosure.

In the display device of the present embodiment, the first substrate 1 is provided with plural pixel units 15. One of these pixel units may be designed as, for example, the equivalent-circuit diagram as shown in FIG. 3. In the equivalent-circuit diagram of FIG. 3, the pixel unit comprises: a driving thin film transistor T1; a switching thin film transistor T2, wherein a scan signal Sn and a data signal Data are transferred to the switching thin film transistor T2; a reset thin film transistor T3, wherein an initialization voltage Vini and a reset signal RST are transferred to the reset thin film transistor T3 for initializing the driving thin film transistor T1; an emitting thin film transistor T4, wherein an emission control signal En is transferred to the emitting thin film transistor T4; a first capacitor C1; and a second capacitor Cst. Hence, the equivalent-circuit diagram shown in FIG. 3 is a 4T2C circuit. In addition, a driving voltage VSS is transferred to an organic light emitting diode OLED; and a cathode of the organic light emitting diode OLED is connected to a common voltage VSS. Herein, the organic light emitting diode display device is exemplified. However, the present disclosure is not limited to, and the above equivalent-circuit diagram can also be applied to an inorganic light emitting diode display device or a liquid crystal display device.

As shown in FIGS. 2 and 3, one of these pixel units 15 comprises several transistors; and each of these transistors can be respectively a transistor comprising a silicon semiconductor layer (for example, low-temperature polycrystalline silicon (LTPS) thin film transistor) or a transistor comprising an oxide semiconductor layer (for example, IGZO thin film transistor). Compared to the IGZO thin film transistor, the LTPS thin film transistor has higher charging ability. Compared to the LTPS thin film transistor, the IGZO thin film transistor has higher process uniformity, better threshold voltage uniformity and lower current leakage. In the present embodiment, theses pixel units 15 comprise both LTPS thin film transistor and IGZO thin film transistor. Furthermore, in another embodiment, these pixel units 15 can include only IGZO thin film transistors.

In addition, as shown in FIG. 2, the driver circuit 14 and the demultiplexer 13 may also comprise plural transistors. The transistors used in the driver circuit 14 and the demultiplexer 13 can be transistors comprising a silicon semiconductor layer (for example, low-temperature polycrystalline silicon (LTPS) thin film transistor) for the narrow border design. In addition, the LTPS thin film transistor can be used in a smaller specific area with good TFT performance uniformity.

Figure 4:
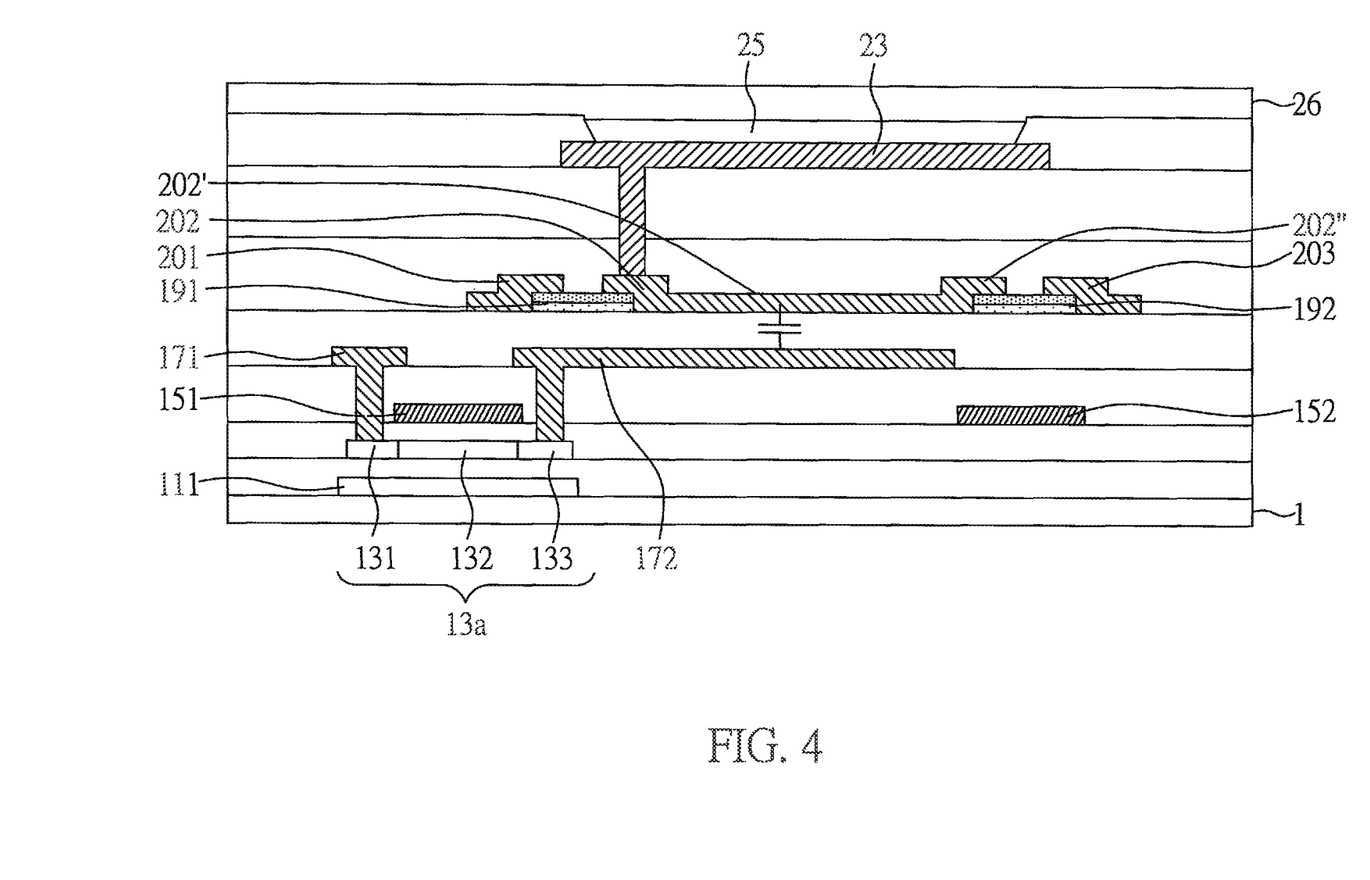
FIG. 4 is a schematic cross sectional view of the display device according to one embodiment of the present disclosure.

FIG. 4 is a schematic cross sectional view of the display device of the present embodiment. Herein, the display device of the present embodiment comprises: a first substrate 1; a LTPS thin film transistor (i.e. a second transistor) disposed over the first substrate 1; two IGZO thin film transistor (i.e. first transistors) disposed over the first substrate 1. Herein, the LTPS thin film transistor comprises: a silicon semiconductor layer 13a comprising a source area 131, a channel area 132 and a drain area 133; a gate electrode 151 correspondingly disposed on the first semiconductor layer 13a; a source electrode 171 and a drain electrode 172 disposed on the gate electrode 151 and respectively electrically connected to the source area 131 and the drain area 133 of the first semiconductor layer 13a. One of the IGZO thin film transistor comprises: an oxide semiconductor layer 191; and a first source electrode 201 and a first drain electrode 202 disposed on the oxide semiconductor layer 191, wherein the drain electrode 172 of the LTPS thin film transistor is also used as the gate electrode of the IGZO thin film transistor. The other one of the IGZO thin film transistor comprises: a first gate electrode 152 disposed over the first substrate 1; another oxide semiconductor layer 192 correspondingly disposed on the first gate electrode 152; another first source electrode 202" and another first drain electrode 203 disposed on the oxide semiconductor layer 192. In addition, the display device of the present embodiment further comprises a display medium layer (i.e. the organic light-emitting diode unit, including the first display electrode 23, the organic light-emitting layer 25 and the second display electrode 26) disposed on the first substrate 1. In the present embodiment and other embodiments of the present disclosure, the LTPS thin film transistor shown in FIG. 4 can be comprised in the pixel unit 15 or in the driver circuit 14 and the demultiplexer 13 shown in FIG. 2. In addition, it should be noted that FIG. 4 is only one example of the display device of the present disclosure and the present disclosure is not limited thereto. Any display device comprising LTPS thin film transistor and IGZO thin film transistor is within the scope of the present disclosure, even though the structures thereof are different from that shown in FIG. 4.

As shown in FIG. 4, the oxide semiconductor layers 191, 192 have a double layered structure. The manufacturing process of the IGZO TFT with the double layered structure is briefly described blow.

Figure 5:
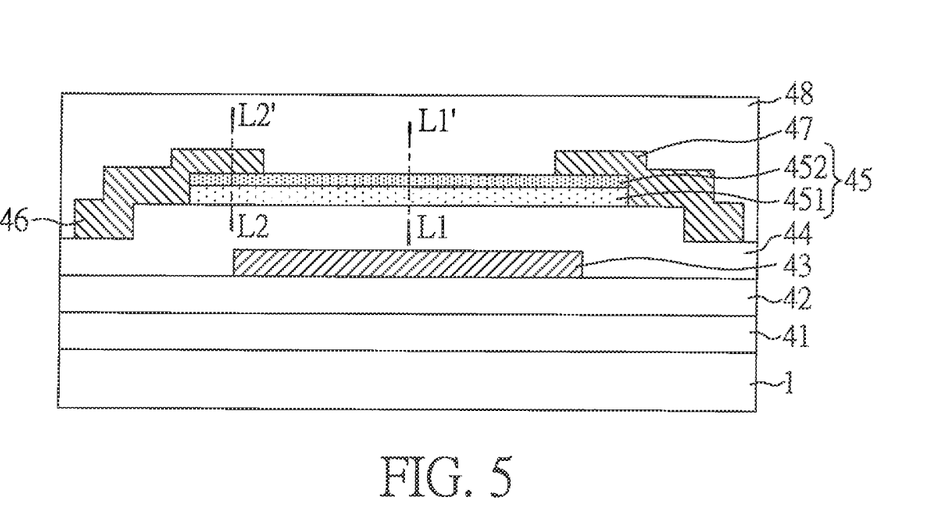
FIG. 5 is a schematic cross sectional view of a transistor according to one embodiment of the present disclosure.

FIG. 5 is a schematic cross sectional view of a transistor of the present disclosure, which is an IGZO thin film transistor (TFT). First, a first substrate 1 is provided, followed by forming a first buffer layer 41 and a second buffer layer 42 on the first substrate 1. Herein, the material for the first substrate 1 is illustrated above and not repeated again. And, the first buffer layer 41 and the second buffer layer 42 can be prepared by any insulating material such as silicon oxide, silicon nitride, silicon nitroxide or a combination thereof. Next, a gate electrode 43 is formed on the second buffer layer 42, followed by forming a gate insulating layer 44 on the gate electrode 43. Then, an oxide semiconductor layer 45 is formed on the gate insulating layer 44, followed by forming a first source electrode 46 and a first drain electrode 47 on the oxide semiconductor layer 45. Finally, a passivation layer 48 is formed on the first source electrode 46 and the first drain electrode 47, and the IGZO TFT of the present embodiment is obtained. Herein, the gate electrode 43, the first source electrode 46 and the first drain electrode 47 can be prepared by metals (such as Cu, Al, Ti, Cr, Mo, or alloy thereof) or other electrode materials (such as transparent conductive oxide, for example, ITO, IZO, ITZO and so on); but the present disclosure is not limited. In addition, the gate insulating layer 44 and the passivation layer 48 can be prepared by silicon oxide.

Hence, after the aforementioned process, the display device of the present embodiment is obtained, which comprises: a first substrate 1; and a first transistor disposed over the first substrate 1, wherein the first transistor comprises an oxide semiconductor layer 45.

In the present embodiment, the oxide semiconductor layer 45 comprises indium, gallium, zinc, and oxygen. The electrical performance of an IGZO TFT is related to the oxygen concentration of the metal oxide layer, as when the oxygen concentration of the metal oxide layer is high, the conductivity of the metal oxide layer is close to a conductivity of an insulator. On the contrary, when the oxygen concentration of the metal oxide layer is low, the conductivity of the metal oxide layer is close to a conductivity of a conductor. Herein, a ratio of an atomic percentage of oxygen to a sum of atomic percentages of indium and gallium in the oxide semiconductor layer 45 is greater than or equal to 1 and less than or equal to 3, i.e. $1 \leq O/(In+Ga) \leq 3$. When the oxygen concentration of the IGZO layer is in the above ratio, the IGZO TFT has better electrical characteristics. Additionally, a ratio of a sum of atomic percentages of indium and gallium to an atomic percentage of zinc in the oxide semiconductor layer 45 (especially, in the first region 451) is greater than or equal to 1 and less than or equal to 3, i.e. $1 \leq (In+Ga)/Zn \leq 3$. When ratio of the concentration of indium, gallium and zinc is in the above range, the IGZO TFT has better voltage stress and current stress performance. Therefore, the IGZO TFT has good reliability.

In addition, the oxide semiconductor layer 45 has a first region 451 and a second region 452, and the first region 451 is between the second region 452 and the first substrate 1. Herein, the first region 451 and the second region 452 can be prepared by using two targets with identical components but different atomic concentrations; or prepared by introducing compositions with identical components but different atomic ratios. However, the present disclosure is not limited to.

In the present embodiment, the first region 451 and the second region 452 are two different layers made of IGZO material with identical components but different atomic concentrations. In another embodiment, the first region 451 and the second region 452 can be two region in the same layer made of IGZO. In the TFT operation period, the current flow occurs in the first region 451, hence the first region 451 suffers voltage stress and current stress, resulting in threshold voltage shift after a period of operation. When IGZO layer has higher indium concentration and higher zinc concentration in the first region 451, the IGZO TFT has higher current and better stability. Besides, the second region 452 is damaged during the etching process for forming the source electrode and drain electrode. When IGZO layer has higher gallium concentration in the second region 452, it provides additional protection for the IGZO layer from damage by following etching process. Therefore the first region 451 is a zinc-rich and indium-rich region, and the second region 452 is a gallium-rich region. More specifically, a concentration of indium in the first region 451 is greater than a concentration of indium in the second region 452; a concentration of zinc in the first region 451 is greater than a concentration of zinc in the second region 452; and a concentration of gallium in the first region 451 is less than a concentration of gallium in the second region 452. When the oxide semiconductor layer 45 comprises the above first region 451 and the above second region 452, the obtained IGZO thin film transistor can have improved electrical performance or reliability.

Particularly, the first region 451 of the oxide semiconductor layer 45 forms the TFT carrier channel. If the first region 451 is the zinc-rich and indium-rich region, the mobility of the semiconducting carrier in IGZO TFT channel can be increased.

In addition, as shown in FIG. 5, the first transistor further comprises: a first gate electrode 43 disposed below the oxide semiconductor layer 45; and a first source electrode 46 and a first drain electrode 47 disposed on the oxide semiconductor layer 45, wherein the first source electrode 46 and the first drain electrode 47 contact the second region 452. Hence, in the present embodiment, the IGZO TFT of the present embodiment is a bottom gate structured IGZO TFT.

In the process for prepared the bottom gate structured IGZO TFT, the first source electrode 46 and the first drain electrode 47 are formed via a dry-etching process or other processes after forming the oxide semiconductor layer 45. Hence, the topmost layer of the oxide semiconductor layer 45 (i.e. the second region 452) may be deteriorated due to the sequential dry-etching process or other processes for forming the first source electrode 46 and the first drain electrode 47. Since gallium in IGZO forms a strong chemical bond with oxygen ions, the formed strong chemical bond can stabilize amorphous state of the IGZO material and reduce the formation of oxygen deficiencies. Hence, in the display device of the present embodiment, the second region 452 is designed to be a gallium-rich region to increase the process durability and electrical stability thereof.

Furthermore, when the second region 452 is a gallium-rich region, the current leakage of the IGZO TFT can be reduced, and good ohmic contact between the second region 452 and the first source electrode 46/the first drain electrode 47 can be achieved. In addition, because the zinc and indium concentrations in the second region 452 are reduced, the current leakage and oxygen deficiencies occurred in the IGZO TFT can also be decreased.

As shown in FIG. 5, the first source electrode 46 and the first drain electrode 47 contact the second region 452. Herein, the metal of the first source electrode 46 and the first drain electrode 47 can be Mo, Ti or other transparence conductive oxides. When the metal with high oxygen affinity (such as Ti) is used as a bottom layer of the first source electrode 46 and the first drain electrode 47 which directly contacts the second region 452, the formation of oxygen deficiencies in IGZO (oxide semiconductor layer 45) can be reduced by using the gallium-rich layer as the second region 452.

Moreover, as described above, both the transistor comprising a silicon semiconductor layer (for example, LTPS TFT) and the transistor comprising an oxide semiconductor layer (for example, IGZO TFT) are comprised in the display device of the present embodiment. The mobility of the LTPS TFT is approximately ten times of the mobility of the IGZO TFT. When the oxide semiconductor layer 45 of the IGZO TFT has the above two layered structure, not only the low current leakage property of the IGZO TFT can be maintained, but also the mobility of the IGZO TFT can further be improved. Therefore, the mobility of the IGZO TFT can more match with the mobility of the LTPS TFT.

As shown in FIG. 5, the display device of the present embodiment further comprises: a gate insulating layer 44 disposed below the oxide semiconductor layer 45; and a passivation layer 48 disposed on the oxide semiconductor layer 45. Even though the gate insulating layer 44 and the passivation layer 48 are prepared by silicon oxide, the oxygen concentrations of the silicon oxide in the gate insulating layer 44 and the passivation layer 48 are different. In the display device of the present embodiment, the first region 451 of the oxide semiconductor layer 45 forms the TFT carrier channel. If the oxygen concentration of the silicon oxide in the gate insulating layer 44 is too high, the insulating property of the gate insulating layer 44 will be decreased. Hence, in the display device of the present embodiment, the oxygen concentration of the silicon oxide in the gate insulating layer 44 is lower than the oxygen concentration of the silicon oxide in the passivation layer 48.

Test Example

Figure 6:
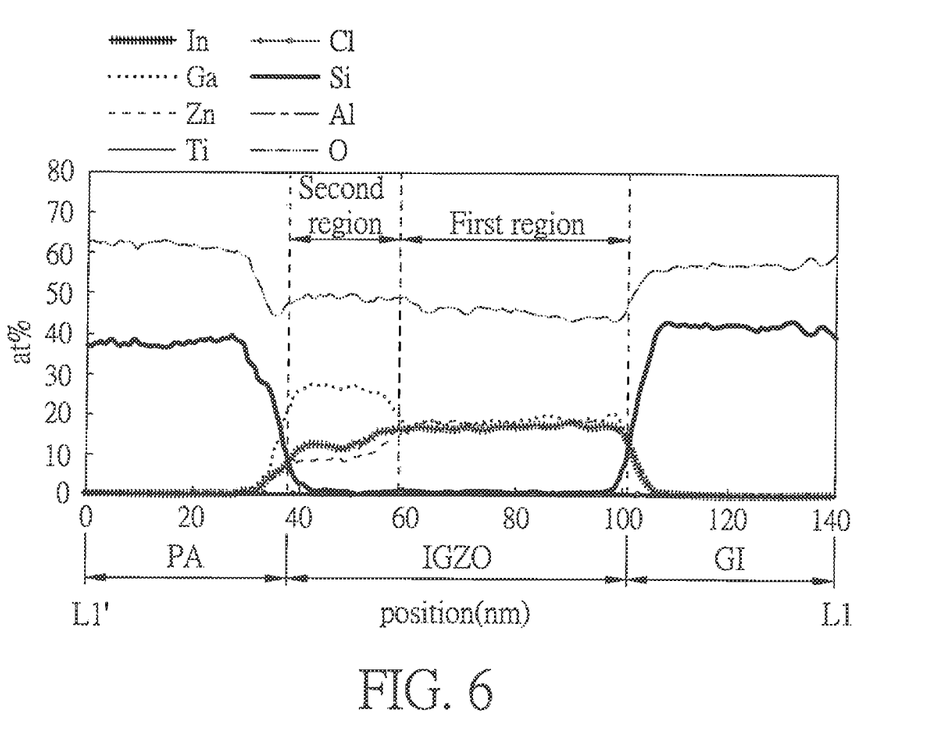
FIG. 6 is an analysis result of the channel region of the oxide semiconductor layer along the line L1-L1' indicated in FIG. 5.
Figure 7:
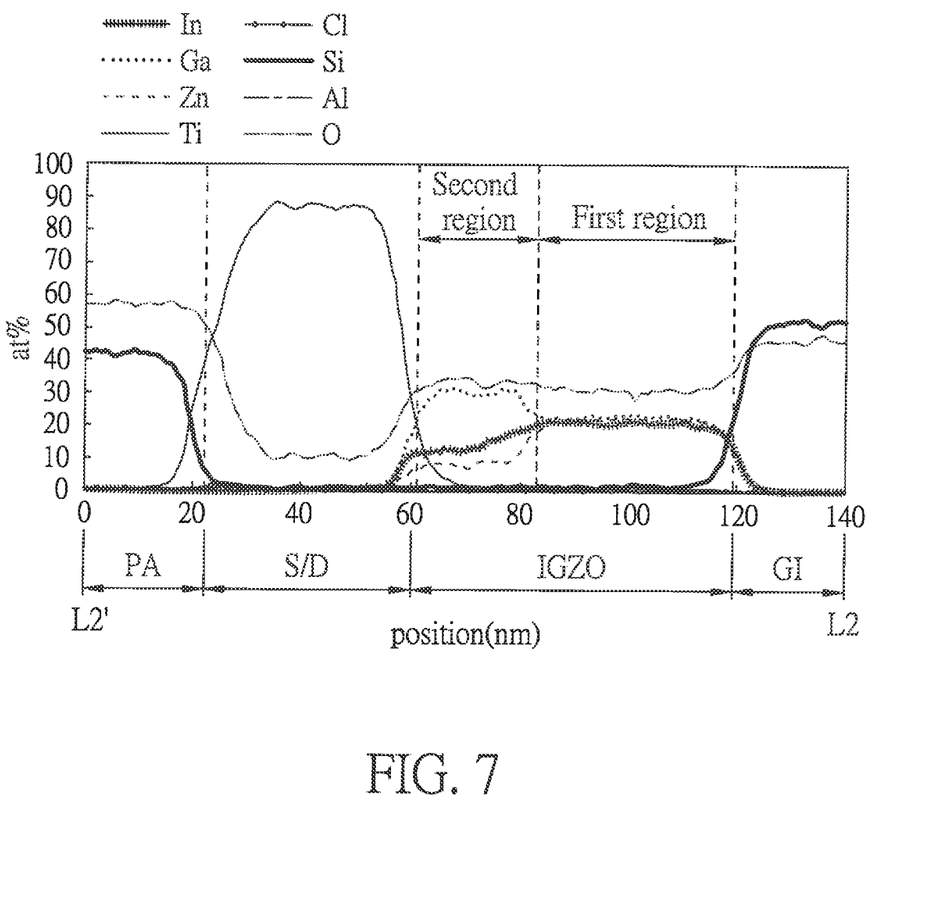
FIG. 7 is an analysis result of the source and drain contact area of the oxide semiconductor layer along the line L2-L2' indicated in FIG. 5.

The display device obtained in the aforementioned embodiment is examined with TEM-EDX equipment; and the IGZO composition of the oxide semiconductor layer is analyzed via a line scan analysis mode. The analysis results are shown in FIGS. 6 and 7, wherein FIG. 6 is an analysis result of the channel region of the oxide semiconductor layer along the line L1-L1' indicated in FIG. 5, and FIG. 7 is an analysis result of the source and drain contact area of the oxide semiconductor layer along the line L2-L2' indicated in FIG. 5. The term "GP" in FIGS. 6 and 7 refers to the gate insulating layer; the term "PA" therein refers to the passivation layer; and the term "S/D" therein refers to the first source/drain electrode.

For the TEM-EDX analytical method, the TFT is cut to form a slit, and a cross-sectional image of the TFT is obtained. Next, the scanning step of the TEM-EDX is commenced, specifically the scanning of the line L1-L1' and the line L2-L2' are started. The scanning line of L1-L1' is made at the middle of the channel area of the TFT, to scan the atomic concentration of the semiconductor layer in the TFT. To further understand the relation of the semiconductor layer and its surrounding interface of insulating layers, the line L1-L1' is scanned starting at the gate insulating layer, into the first region and the second region of the semiconductor layer, and ends at the passivation layer. While the line L2-L2' is scanned to further understand the interface interaction of the semiconductor and the contacting source/drain electrodes, so the line L2-L2' is made at one of the source/drain electrode ends of the TFT. The line L2-L2' starts at the gate insulating layer, into the first region and the second region of the semiconductor layer, and further into the metal layer of the source/drain electrode, before it ends at the passivation layer.

The atomic percentages (at. %) of the elements comprised in the channel region of the oxide semiconductor layer are listed in the following Table 1. It should be noted that the values shown in the table are the average values of the atomic percentages of the elements measured at the middle-thickness portion of the layers. The material analysis can't get exact concentration of each element. As shown in Table 1, the measured atomic percentage of indium, gallium and zinc are 16.34%, 19.22% and 17.28% in the first region. However, as shown in FIG. 6, the error of atomic percentage measurement of indium, gallium and zinc are plus or minus 1.1%, 1.6% and 0.5%, respectively, in the first region. As shown in Table 1, the measured atomic percentage of indium, gallium and zinc are 13.36%, 25.86% and 10.62% in the second region. However, as shown in FIG. 6, the error of atomic percentage measurement of indium, gallium and zinc are plus or minus 2.96%, 2.16% and 1.82%, respectively, in the second region. Similarly, the error of atomic percentage measurement of silicon in the gate insulating layer, the first region of IGZO, the second region of IGZO and the passivation are plus or minus 1.8%, 0.5%, 1.14% and 3% respectively. As shown in FIG. 6 and the following Table 1, at the channel region of the oxide semiconductor layer, the second region of the

TABLE 1

| Layer | Indium (at. %) | Gallium (at. %) | Zinc (at. %) | Silicon (at. %) |
| --- | --- | --- | --- | --- |
| Gate Insulating Layer | — | — | — | 42.36 |
| IGZO, First region | 16.34 | 19.22 | 17.28 | 0.50 |
| IGZO, Second region | 13.36 | 25.86 | 10.62 | 2.03 |
| Passivation layer | — | — | — | 37.24 |

In addition, as shown in FIG. 7, at the source and drain contact area of the oxide semiconductor layer, the second region of the oxide semiconductor layer is also gallium rich. Herein, the first source/drain electrodes are made of Ti. Since gallium in IGZO forms a strong chemical bond with oxygen ions, the formed strong chemical bond can stabilize amorphous state of the IGZO material and reduce the formation of oxygen deficiencies. Hence, the diffusion of Ti to the second region can be reduced. If the second region of the oxide semiconductor layer is not gallium rich, $TiO_2$ may be formed by the diffused Ti and the oxygen in IGZO. The formed $TiO_2$ is an insulator, resulting in the ohmic contact between the IGZO and the first source/drain electrodes decreased. Therefore, when the second region of the oxide semiconductor layer is gallium rich, the Ti diffusion and oxygen deficiencies in the second region can be reduced.

Other Embodiments

A display device made as described in any of the embodiments of the present disclosure as described previously may be integrated with a touch panel to form a touch display device. Moreover, a display device or touch display device made as described in any of the embodiments of the present disclosure as described previously may be applied to any electronic devices known in the art that need a display screen, such as displays, mobile phones, laptops, video cameras, still cameras, music players, mobile navigators, TV sets, and other electronic devices that display images.

Although the present disclosure has been explained in relation to its embodiment, it is to be understood that many other possible modifications and variations can be made without departing from the spirit and scope of the disclosure as hereinafter claimed.

What is claimed is:

1. A display device, comprising a display region and a peripheral region adjacent to the display region, and the display device comprising:
    a first substrate;
    a first transistor disposed on the first substrate and disposed in the display region, wherein the first transistor comprises a first gate electrode, a first drain electrode, a first source electrode, and a first oxide semiconductor layer, the first oxide semiconductor layer is disposed on the first gate electrode, and the first drain electrode and the first source electrode are electrically connected to the first oxide semiconductor layer; and
    a second transistor disposed on the first substrate and disposed in the peripheral region, wherein the second transistor comprises a second gate electrode, a second drain electrode, a second source electrode, and a silicon semiconductor layer, the second gate electrode is disposed on the silicon semiconductor layer, the second drain electrode and the second source electrode are electrically connected to the silicon semiconductor layer, and the first gate electrode is electrically connected to one of the second drain electrode and the second source electrode.

2. The display device of claim 1, further comprising a gate insulating layer disposed between the first gate electrode and the first oxide semiconductor layer, wherein a maximum atomic percentage of oxygen in the gate insulating layer is greater than a maximum atomic percentage of oxygen in the first oxide semiconductor layer.

3. The display device of claim 2, wherein the gate insulating layer comprises silicon oxide.

4. The display device of claim 1, wherein a maximum atomic percentages of oxygen in the first oxide semiconductor layer is lower than a maximum atomic percentage of oxygen in the first drain electrode or in the first source electrode.

5. The display device of claim 1, further comprising a passivation layer disposed on the first oxide semiconductor layer, wherein a maximum atomic percentage of oxygen in the passivation layer is greater than a maximum atomic percentage of oxygen in the first oxide semiconductor layer.

6. The display device of claim 5, wherein the passivation layer comprises silicon oxide.

7. The display device of claim 1, further comprising a gate insulating layer disposed between the first gate electrode and the first oxide semiconductor layer and a passivation layer disposed on the first oxide semiconductor layer, wherein a maximum atomic percentage of oxygen in the passivation layer is greater than a maximum atomic percentage of oxygen in the gate insulating layer.

8. The display device of claim 1, wherein the first oxide semiconductor layer is an IGZO layer.

9. The display device of claim 1, wherein the silicon semiconductor layer is a low-temperature polycrystalline silicon semiconductor layer.

10. The display device of claim 1, wherein the first oxide semiconductor layer comprises a first channel area between the first drain electrode and the first source electrode, the silicon semiconductor layer comprises a second channel area between the second drain electrode and the second source electrode, and a length of the second channel area is greater than a length of the first channel area.

11. The display device of claim 1, the second drain electrode is at least partially overlapped with the first drain electrode to form a capacitor in a cross-section of the display device.

12. The display device of claim 1, further comprising a third transistor disposed on the substrate, wherein the third transistor comprises a third gate electrode, a third drain electrode, a third source electrode and a second oxide semiconductor layer, and the third source electrode is electrically connected to the first drain electrode.

13. The display device of claim 12, wherein the third source electrode and the first drain electrode comprise the same metal material.

14. The display device of claim 12, wherein the second oxide semiconductor layer is an IGZO layer.

15. The display device of claim 12, the third gate electrode and the second gate electrode comprise the same metal material.

16. The display device of claim 1, further comprising a display medium layer electrically connected to the first transistor.

17. The display device of claim 16, wherein the display medium layer is an organic light-emitting diode layer.

18. The display device of claim 1, wherein the first substrate comprises a flexible substrate.

* * * * *